United States Patent
Smith et al.

(10) Patent No.: US 7,180,264 B2
(45) Date of Patent: Feb. 20, 2007

(54) FUEL FLEXIBLE THERMOELECTRIC GENERATOR WITH BATTERY CHARGER

(75) Inventors: C. W. Sinjin Smith, Palm Bay, FL (US); Charles M. Newton, Palm Bay, FL (US); Richard Gassman, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 414 days.

(21) Appl. No.: 10/910,536

(22) Filed: Aug. 3, 2004

(65) Prior Publication Data

US 2006/0028165 A1    Feb. 9, 2006

(51) Int. Cl.
*H01M 10/46* (2006.01)
(52) U.S. Cl. .................................... 320/101
(58) Field of Classification Search ............... 320/101, 320/107, 115; 429/7, 12, 17, 19; 136/200, 136/201, 205, 207
See application file for complete search history.

(56) References Cited

U.S. PATENT DOCUMENTS

| | | | |
|---|---|---|---|
| 5,436,467 A | 7/1995 | Elsner et al. | 257/15 |
| 5,550,387 A | 8/1996 | Elsner et al. | 257/15 |
| 6,096,965 A | 8/2000 | Ghamaty et al. | 136/201 |
| 6,193,501 B1 | 2/2001 | Masel et al. | 431/170 |
| 6,613,972 B2 | 9/2003 | Cohen et al. | 136/209 |
| 2003/0027022 A1 | 2/2003 | Arana et al. | 429/17 |
| 2003/0091502 A1 | 5/2003 | Holladay et al. | 423/652 |
| 2003/0232300 A1 | 12/2003 | Maruta et al. | 431/328 |

*Primary Examiner*—Edward H. Tso
(74) *Attorney, Agent, or Firm*—GrayRobinson, P.A.

(57) ABSTRACT

A micro-generator for providing electrical power to a battery charger capable of charging lithium ion, lithium polymer and other rechargeable batteries of the type which power portable electronic devices and MEMS. The micro-generator includes a micro-combustor and a thermoelectric module consisting of a number of quantum well thermoelectric panels connected between spaced heat spreaders, one of which is mounted in thermal communication with the micro-combustor. Different types of hydrocarbon fuel may be supplied to the micro-combustor where it is burned within a combustion chamber. The entire system is controlled in real time by a micro-controller which is powered upon start up by an ultra capacitor and thereafter by the electric power produced by the thermoelectric module.

11 Claims, 5 Drawing Sheets

FUEL FLEXIBLE THERMOELECTRIC GENERATOR WITH BATTERY CHARGER

FIELD OF THE INVENTION

This invention is directed to a system for generating electrical energy, and, more particularly, to a micro-generator having a micro-combustor capable of operating with different types of fuel mounted in thermal communication to a thermoelectric module which generates electric energy.

BACKGROUND OF THE INVENTION

Portable electronic devices and micro-electro-mechanical-systems ("MEMS") are conventionally powered by batteries. With the advancing sophistication of such devices, and an ever increasing need for more power, improvements have been made to the shelf life, efficiency and overall useful life of batteries in recent years. Rechargeable batteries, such a lithium ion and lithium polymer ("Li-Poly") batteries, are also in widespread use due to their reliability, relatively high power output and comparatively long useful life.

While rechargeable batteries have a much longer useful life than those which cannot be recharged, an obvious limitation of their use is that they must be periodically recharged. Depending on the extent of use, even modern lithium ion and Li-Poly batteries may need to be recharged on a daily basis or every two to three days. This presents a problem in the field, such as for those portable electronic devices and MEMS used by the military and others, where a ready source of electrical power to recharge batteries may not be available for days at a time.

U.S. Pat. No. 6,613,972 discloses a portable micro-generator system designed to generate electrical power which employs a micro-combustor that operates with hydrocarbon fuel. Propane, butane or methylacetylene combined with air is supplied to the micro-combustor where it is burned within a combustion region to produce heat. One or more internal walls of the micro-combustor are formed of a thermoelectric material which is capable of producing electrical energy when exposed to a temperature differential. This temperature differential is created by directing a flow of incoming, cooler air-fuel mixture, and the heated exhaust gas produced from combustion, past opposite surfaces of the thermoelectric material.

Micro-generators of the type disclosed in the '972 patent have an efficiency in converting thermal energy to electrical energy on the order of about 5%. This limits the amount of electrical energy which can be obtained from the device, and therefore restricts its usefulness in directly powering portable electronic devices and MEMS, or in providing electrical energy to recharge batteries used in such devices. Additionally, fuel consumption can become an issue given such a low conversion efficiency. Consequently, the micro-generator of the '972 patent has limited practical application in its present form.

SUMMARY OF THE INVENTION

This invention is directed to a portable micro-generator for providing electrical energy to a battery charger capable of charging lithium ion, lithium polymer and other rechargeable batteries used to power portable electronic devices and MEMS. The micro-generator includes a micro-combustor and a thermoelectric module consisting of a number of quantum well thermoelectric panels connected between spaced heat spreaders, one of which is mounted in thermal communication with the micro-combustor. Different types of hydrocarbon fuel may be supplied to the micro-combustor where it is burned within a combustion chamber. The entire system is controlled in real time by a micro-controller which is powered at start up by an ultra capacitor and thereafter by electrical energy produced by the thermoelectric module.

One aspect of this invention is predicated upon the concept of improving the efficiency of conversion of thermal energy to electrical energy by employing a thermoelectric module which includes quantum well thermoelectric modules. A first heat spreader is mounted to the micro-combustor at or near the combustion area where temperatures during operation are on the order of 200° C. A second heat spreader is spaced from the first heat spreader to create a temperature differential across the quantum well thermoelectric panels connected between the two heat spreaders. These panels, in combination with the thermal spreaders, convert thermal energy to electrical energy at efficiencies on the order of 14 to 20% which is far superior to that obtained from the micro-generator of the U.S. Pat. No. 6,613,972 patent. Such an increase in the conversion efficiency allows the micro-generator of this invention to output sufficient electrical energy to power a battery charger for lithium ion, Li-Poly or other rechargeable batteries.

Another important aspect of this invention is that the micro-combustor can be operated with a variety of different hydrocarbon fuels including both those which are in vapor form at ambient temperatures, such as propane and butane, and those in liquid form, e.g., gasoline, kerosene, diesel fuel and the like. This capability allows the micro-generator of this invention to be used in virtually any location where there is a source of hydrocarbon fuel.

A low power micro-controller operates the entire system, and a display can be provided to provide information in real time on the quantity of fuel available, the voltage output, temperature of the thermoelectric module and other parameters of the system operation.

BRIEF DESCRIPTION OF THE DRAWINGS

The structure, operation and advantages of the presently preferred embodiment of this invention will become further apparent upon consideration of the following description, taken in conjunction with the accompanying drawings, wherein.

DETAILED DESCRIPTION OF THE INVENTION

Figure 1:
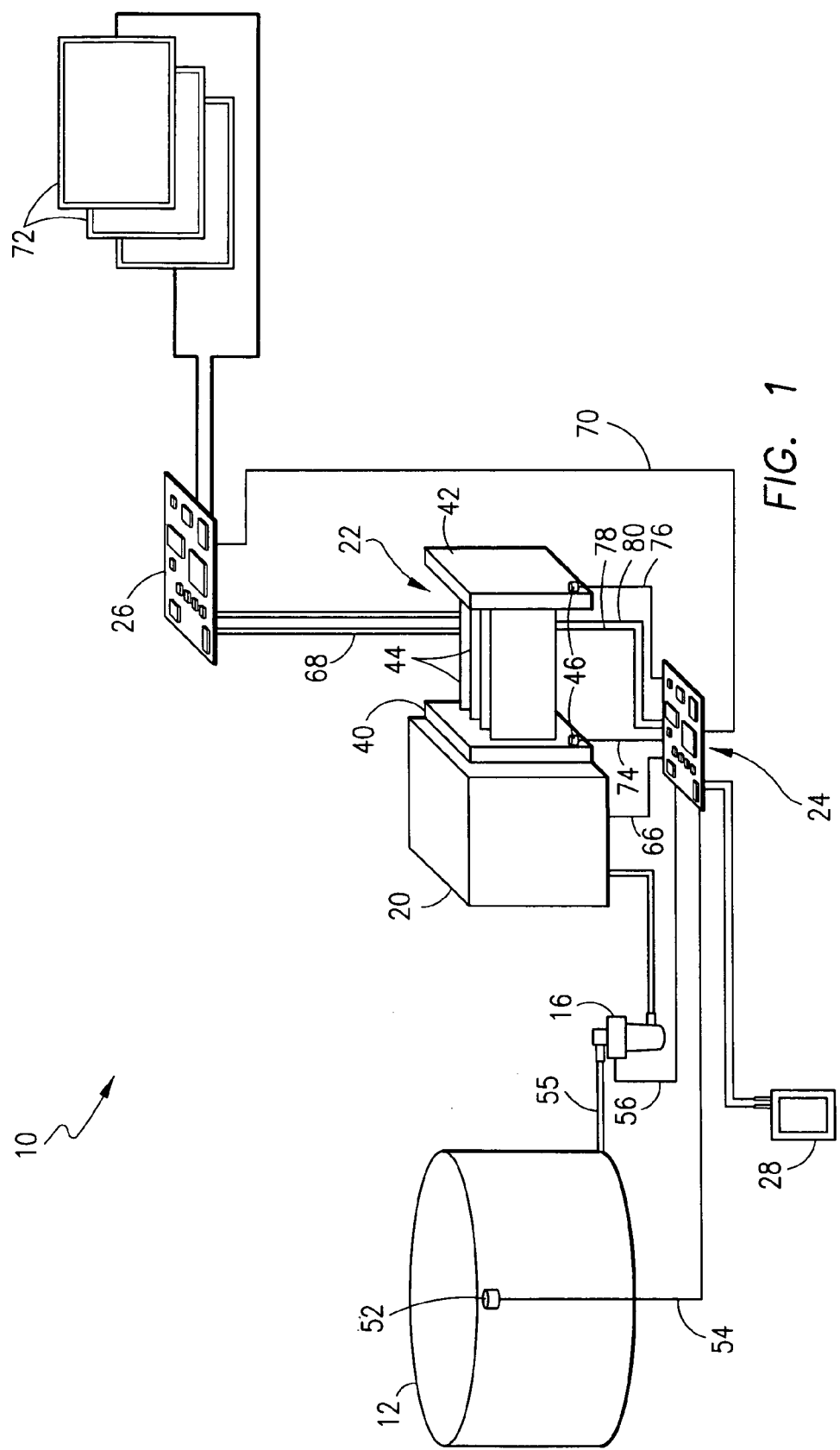
FIG. 1 is a schematic view of one embodiment of the micro-generator system of this invention coupled to a battery charger.
Figure 2:
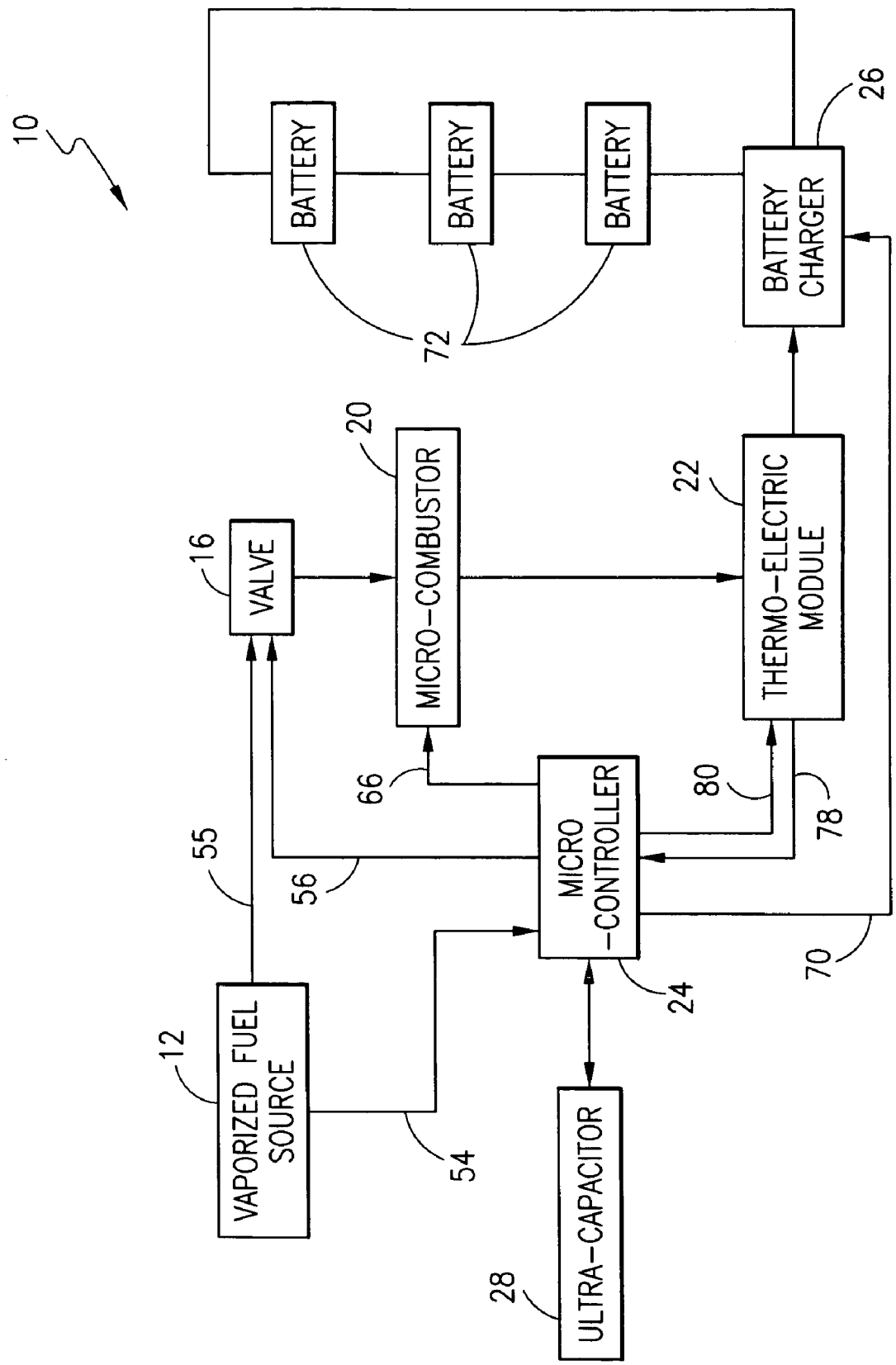
FIG. 2 is a block diagram depicting the system components shown in FIG. 1.
Figure 5:
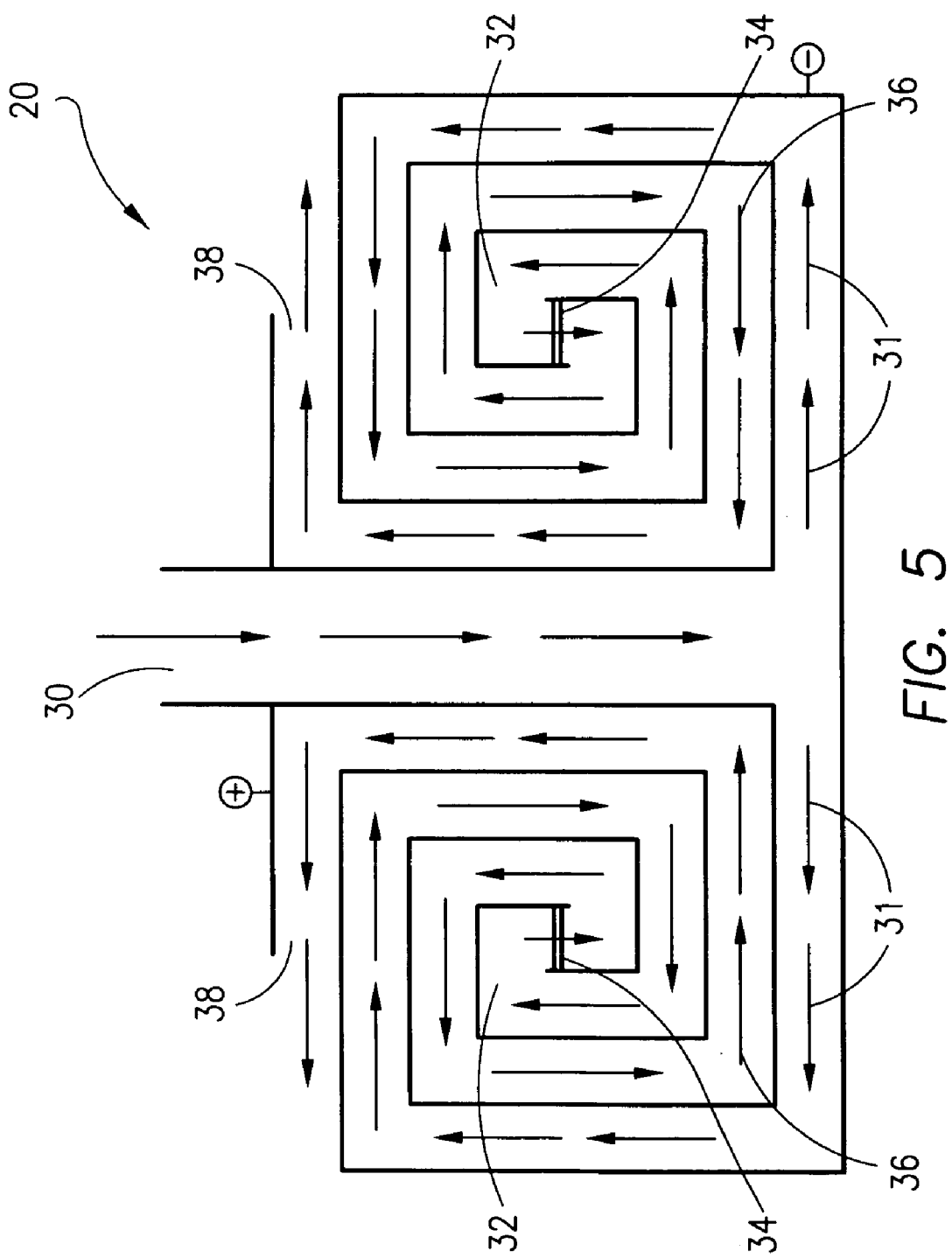
FIG. 5 is a schematic cross-sectional view of the micro-combustor employed in the system of in FIGS. 1 and 3.

Referring now to the FIGS. 1, 2 and 5, one embodiment of a micro-generator system 10 is schematically depicted in FIG. 1. The system 10 includes a fuel source 12, a fuel control valve 16, a micro-combustor 20, a thermoelectric module 22, a micro-controller 24 with an LCD or other display (not shown), a battery charger 26, and, an ultra-capacitor 28. The system 10 is operative to generate approximately 168 milliamps at 12 volts DC using the configuration described separately below. It should be understood, however, that the system 10 is scalable and its components can be altered in size and capacity to increase the power output, as desired. The several elements of the system 10, as well as an alternative system 50, are described below followed by a discussion of their overall operation.

The heart of the system 10 is the micro-combustor 20 which is a modified version of the micro-combustor described in U.S. Pat. No. 6,613,972 (the '972 patent), the disclosure of which is incorporated by reference in its entirety herein. Except for that described below, the construction of the micro-combustor 20 is the same as that disclosed in the '972 patent, forms no part of this invention and is therefore discussed only generally herein.

As schematically shown in FIG. 5, the micro-combustor 20 is preferably a double spiral or "swiss-roll" design having two sides which are essentially mirror images of one another with a common fuel inlet 30. Vaporized fuel mixed with air, as described below, is introduced through the inlet 30 and moves along the flow paths shown by arrows 31 to a combustion chamber 32 near the center of each side. An igniter 34 is positioned in the area of each combustion chamber 32, which can take the form of conductive material that is resistively heated to ignite combustion, or several other variants described in the '972 patent. Hot exhaust gas produced by combustion of the fuel exits the combustion chambers 32 and moves along each side of the micro-combustor as depicted by arrows 36 to exhaust outlets 38. While two exhaust outlets 38 are shown in FIG. 5, it should be understood that a single exhaust outlet 38 may be provided or the two exhaust outlets 38 can be combined as one.

The principal difference between micro-combustor 20 and the one disclosed in the '972 patent, is that in the patented system one or more internal walls of the micro-combustor are formed of a thermoelectric material to generate power. A temperature differential is created by the flow of cooler, air-fuel mixture along one side of such wall(s), and the flow of hot exhaust gas along the opposite side of the thermoelectric material. It has been found that greatly improved efficiency in converting thermal energy to electrical power is obtained by the use of the thermoelectric module 22 of this invention, which is mounted externally of the micro-combustor 20 but in thermal communication with each of its combustion chambers 32. Whereas the efficiency of the system described in the '972 patent is on the order of 5%, efficiencies in the range of 14% to 20% are obtained with the present invention.

In the presently preferred embodiment, the thermoelectric module 22 comprises a first heat spreader 40 mounted to the micro-combustor 20 in thermal communication with its combustion chambers 32, a second heat spreader 42 spaced from the first heat spreader 40 and a number of quantum well thermoelectric panels 44 oriented parallel to one another and connected between the first and second heat spreaders 40, 42. Each heat spreader 40 and 42 is preferably formed as a plate from aluminum silica carbide. This material is a combination of metal and ceramics which is used extensively in the semiconductor industry. It exhibits excellent heat transfer capability, and can withstand the temperatures produced by the micro-combustor 20 which are typically on the order of about 1300° C. during operation.

The quantum well thermoelectric panels 44 are preferably of the type described in U.S. Pat. Nos. 5,436,467; 5,550,387 and/or 6,096,965, the disclosures of which are incorporated by reference in their entireties herein. The detailed construction of the quantum well thermoelectric panels 44 forms no part of this invention, and is therefore not discussed herein. As is well known, thermoelectric material has the ability of generating electric energy when exposed to a temperature differential across its surface. Panels 44 are particularly efficient in converting thermal energy to electrical energy, and the first heat spreader 40 is effective to uniformly transfer the heat from micro-combustor 20 over its entire surface area to one end of each of the panels 44. Because the second heat spreader 42 is physically spaced from the first heat spreader 40, as depicted in FIG. 1, its temperature is approximately ambient. Consequently, a substantial ΔT or temperature differential is provided from the "hot" end of each panel 44, e.g. at a minimum of 200° C., to its opposite, "cool" end which is at about ambient temperature. A thermistor 46 or other temperature sensing device coupled to the micro-controller 24 is mounted to each heat spreader 40, 42 to permit monitoring of their temperatures, as discussed below.

An important aspect of this invention involves the ability of the system to employ different types of hydrocarbon fuel for combustion in the micro-combustor 20. In the embodiment of FIGS. 1 and 2, the apparatus 10 is designed to supply hydrocarbon fuel which is in vapor form at ambient temperature, such as propane, butane and methylacetylene. The apparatus 50 illustrated in FIGS. 3 and 4, and discussed below, is intended for use with hydrocarbon fuels in liquid form, e.g. gasoline, kerosene, diesel and others. This adds to the versatility and flexibility of the system of this invention, and allows for its use in field applications of all types, including, for example, military use where existing infrastructure can be employed to provide a source of fuel.

In the embodiment of FIGS. 1 and 2, pressurized propane or butane is contained in a tank identified as fuel source 12 in the FIGS., the volume of which is dictated by the size of the other system components. Preferably, a level sensor 52 is mounted within the fuel source 12 which is connected by a lead 54 to the micro-controller 24 to permit measurement of the fuel level therein. The fuel control valve 16 is connected between the fuel source 12 and micro-combustor 20 within line 55, and it is coupled by lead 56 to the micro-controller 24. The fluid control valve 14 is a commercially available solenoid valve whose operation is described below in connection with a discussion of the overall operation of the system 10.

Figure 3:
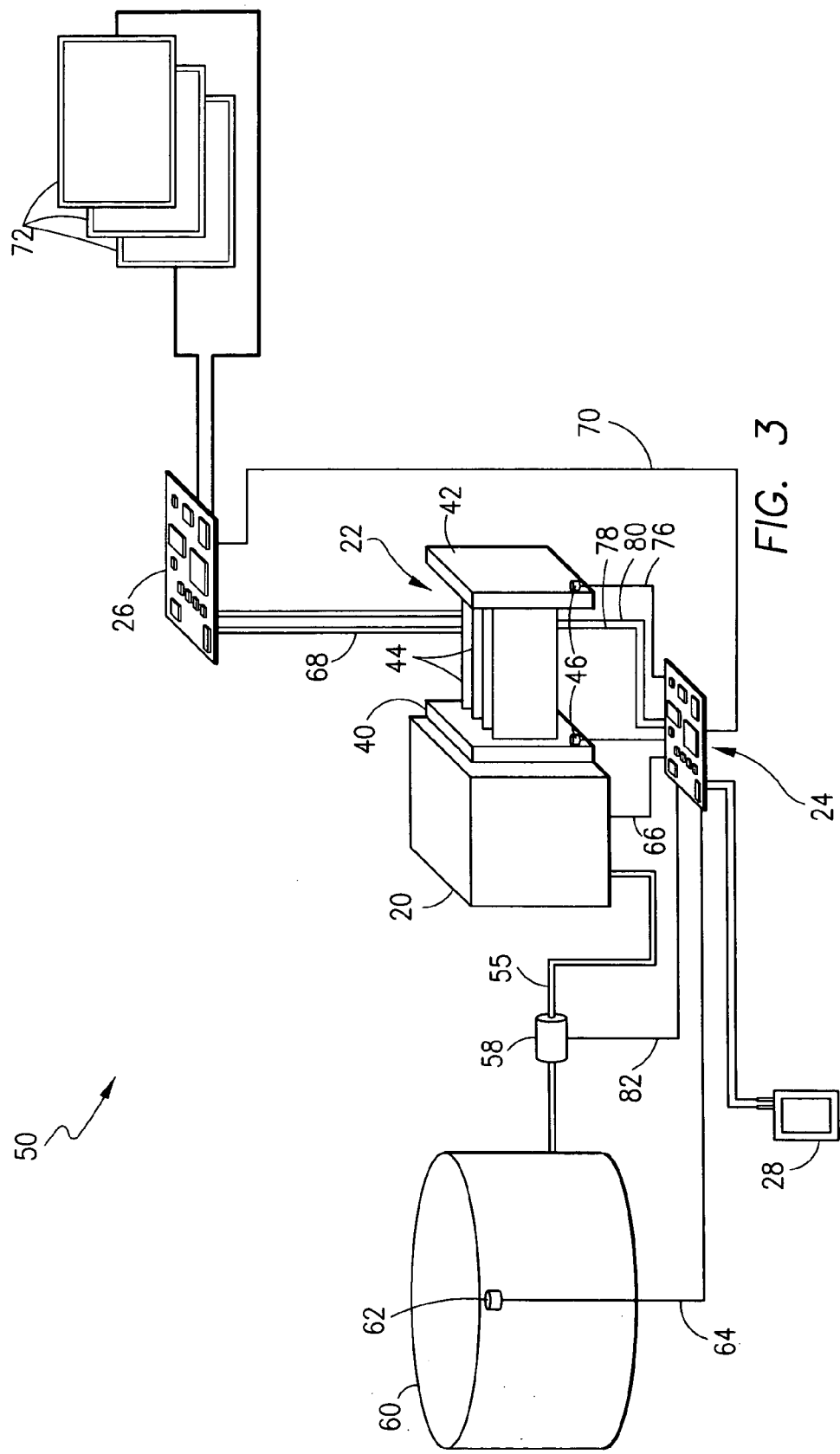
FIG. 3 is a schematic view of an alternative embodiment of the micro-generator system herein.
Figure 4:
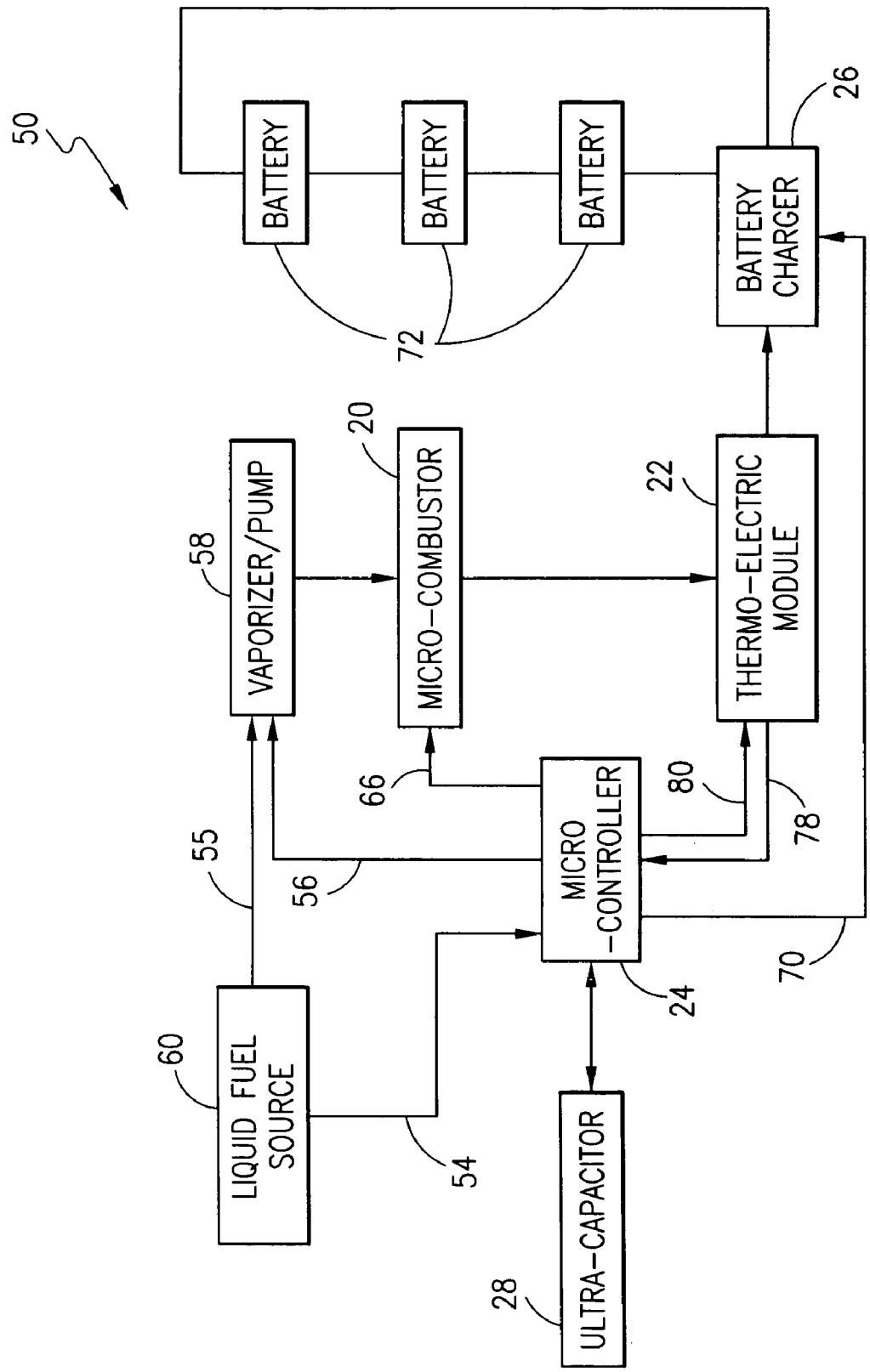
FIG. 4 is a block diagram of the system components illustrated in FIG. 3.

The apparatus 50 depicted in FIGS. 3 and 4 is similar to apparatus 10, and structure common to both is given the same reference numbers in FIGS. 3 and 4 as in FIGS. 1 and 2. As noted above, apparatus 50 is intended for use with liquid hydrocarbon fuels such as gasoline. In order to maximize efficiency of combustion within the micro-combustor 20, the liquid fuel must be converted to vapor form prior to introduction into the inlet 30 of micro-combustor 20. In the presently preferred embodiment, a vaporizer/pump 58 is connected along the line 55 between a fuel source 60 containing liquid fuel and the micro-combustor 20. The fuel source 60 includes a level sensor 62 connected by a lead 64 to the micro-controller 24. One suitable commercially available vaporizer/pump 58 is a Vapore-Jet Capillary Force Vaporizer/Pump, Part No. 100059 (5 mm diameter), manufactured by Vapore, Inc. of Richmond, Calif. This unit is operative to pump liquid fuel from then fuel source, convert it to vapor form and then pump the vaporized fuel to the inlet 30 of the micro-combustor 20, all in response to signals from the micro-controller 24 as described below.

System Operation

With reference to FIGS. 1 and 2, operation of the system 10 proceeds as follows. The micro-controller 24 controls system operation in real time. It is preferably a commercially available item, such as the MSP-430 series from Texas Instruments, having data acquisition capability and multiple sleep modes. At start up, the micro-controller 24 receives electrical energy from the ultra-capacitor 28 which is charged during operation of the system 10. The micro-controller 24 inputs a signal through lead 56 to the fuel control valve 16 causing it to open and permit fuel under pressure within the fuel source 12 to flow to the micro-combustor 20. The fuel control valve 16 may be operated to remain in an open position to allow for a constant flow of fuel to the micro-controller 20. Alternatively, a pulse width modulated signal may be generated by the micro-controller 24 and input to the fuel control valve 16 to sequentially open and close it, thus producing a pulsed flow of fuel to the micro-combustor 20. In either case, the fuel is directed to the fuel inlet 30 of the micro-combustor 20 where it flows along the path depicted by arrows 31 to the combustion chambers 32 on either side of the micro-combustor 20.

The micro-controller 24 is coupled to each igniter 34, as schematically depicted by lead 66 in FIGS. 1 and 2, to initiate combustion of the fuel within combustion chambers 32. In one presently preferred embodiment, the micro-controller 20 inputs a pulse width modulated signal to the igniters 34 thus allowing for an adjustable burn rate of fuel. For example, activation of the igniters 34 can be timed to coincide with the pulsed supply of fuel from the fuel control valve 16 to improve efficiency and adjust the rate at which the fuel is burned in the micro-combustor 20.

Once the combustion process has begun within the micro-combustor 20, its combustion chambers 32 and the surrounding walls quickly reach a temperature on the order of 800° C. Because the first heat spreader 40 is mounted to the micro-combustor 20 in close proximity to and in thermal communication with the combustion chambers 32 and surrounding walls, it too reaches substantially the same temperature. The heat spreader 40 uniformly distributes the heat from micro-combustor 20 throughout its length and width, which, in turn, is transferred to the end of each quantum well thermoelectric panel 44 connected to the heat spreader 40. The opposite end of each panel 44 is connected to the "cool" or second heat spreader 42 which is spaced from the hot heat spreader 40 and resides at approximately ambient temperature. The $\Delta T$ between the heat spreaders 40 and 42 induces the panels 44 to convert thermal energy to electrical energy, and they do so at an efficiency of about 14% to 20%. The higher the $\Delta T$, the higher the efficiency within the current theoretical limits of the Quantum Well technology. The panels 44 produce an output, schematically identified with the reference number 68 in FIGS. 1 and 2, which, in the presently preferred embodiment, is on the order of 168 milliamps at 12 volts DC.

The electrical energy produced by the panels 44 is input through line 68 to the battery charger 26, which, in turn, is coupled to the micro-controller 24 by a lead 70. In the presently preferred embodiment, one suitable battery charger 26 is an Li-Poly charger commercially available under the product designation "Apache Li-Poly 2500 Charger" from Northeast Sailplane Products of Colchester, Vt. It should be understood that other battery chargers could be employed in the apparatus 10 or 50 of this invention for charging lithium ion, Li-Poly or other rechargeable batteries.

As shown in the FIGS., the battery charger 26 is coupled to several Li-Poly batteries 72, which are connected in series for higher voltage output.

The micro-controller 24 receives a signal from each thermistor 46 via leads 74 and 76, which are representative of the temperature of the heat spreaders 40 and 42, respectively. This data is displayed in real time on the display of the micro-controller 24. The micro-controller 24 is also coupled to the thermoelectric panels 44 by leads 78 and 80 to receive electrical energy while the system 10 is running for its own operation, and to re-charge the ultra-capacitor 28. The micro-controller 24 is operative to display the voltage being produced by the panels 44 on the LCD display 26, also in real time. Due to the connection via lead 54 between the level sensor 52 in the fuel source 12 and the micro-controller 24, the quantity of fuel remaining and/or the anticipated run time of the system 10 with the amount of fuel present in the fuel source 12 can also be displayed by the micro-controller 24. Another reading can be provided on the display of the micro-controller 24 indicating when charging of the batteries 72 has been completed.

The apparatus 50 shown in FIGS. 3 and 4 operates in the same manner as apparatus 10, except for the supply of fuel to the micro-combustor 20. In this embodiment, the micro-controller 24 inputs a signal to the vaporizer/pump 58 via a lead 82 causing liquid fuel from the fuel source 60 to be pumped into the vaporizer/pump 58 where it is converted to vapor form and transmitted through line 55 to the inlet 30 of micro-combustor 20. The micro-controller 24 can operate the vaporizer/pump 58 to remain in a constant "open" position during operation, or, it can input a pulse width modulated signal to the vaporizer/pump 58 to alternately open and close it in the same manner as the valve 16 in FIGS. 1 and 2, as described above. The apparatus 50 otherwise operates in the same fashion as apparatus 10.

The system 10 and 50 of this invention provide a compact, relatively efficient and fuel flexible system for the generation of electric energy whose operation can be controlled and monitored in real time. The system is a viable means of providing electrical energy for charging batteries such a lithium ion and Li-Poly batteries used to power portable electronic devices and MEMS.

While the invention has been described with reference to a preferred embodiment, it should be understood by those skilled in the art that various changes may be made and equivalents substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for generating electrical power, comprising:
   a micro-combustor having a fuel inlet, an exhaust outlet, a combustion chamber and an igniter operative to initiate combustion of fuel within said combustion chamber which produces hot exhaust gas directed to said exhaust outlet;
   a micro-controller coupled to said igniter of said micro-combustor;
   a fuel control device which supplies fuel from a source to said micro-combustor, said fuel control device being coupled to said micro-controller which controls opening and closing of said fuel control device;

a thermoelectric module having a first end mounted in thermal communication with said micro-combustor, a second end spaced from said first end and a number of thermoelectric panels connected between said first and second ends, a temperature differential being produced between said first and second ends of said thermoelectric module which induces said thermoelectric module to supply electrical energy to an outlet; and a battery charger coupled to said outlet of said thermoelectric module, said battery charger being electrically connected to at least one battery.

2. The system of claim 1 in which said battery charger is a lithium polymer battery charger connected to a number of lithium polymer batteries arranged is series.

3. The system of claim 1 in which the source of fuel contains hydrocarbon fuel in vapor form at ambient temperature, said fuel control device comprising a fuel control valve connected between the source of fuel and said micro-combustor.

4. The system of claim 1 in which the source of fuel contains liquid hydrocarbon fuel, said fuel control device comprising a vaporizer/pump connected between the source of fuel and said micro-combustor.

5. A system for generating electrical energy comprising:
a micro-combustor having a fuel inlet, an exhaust outlet, a combustion chamber and an igniter operative to initiate combustion of fuel within said combustion chamber which produces hot exhaust gas directed to said exhaust outlet;

a micro-controller coupled to said igniter of said micro-combustor;

a thermoelectric module having a first heat spreader mounted in thermal communication with said micro-combustor, a second heat spreader spaced from said first heat spreader and a number of quantum well thermoelectric panels connected between said first and second panels, a temperature differential being produced between said first and second heat spreaders which induces said quantum well thermoelectric modules to supply electrical energy to an outlet; and a battery charger coupled to said outlet of said thermoelectric module, said battery charger being electrically connected to at least one battery.

6. The system of claim 5 in which each of said first and second heat spreaders is formed of aluminum silicon carbide.

7. The system of claim 5 in which said battery charger is a lithium polymer battery charger connected to a number of lithium polymer batteries arranged is series.

8. A system for generating electrical energy, comprising:
a micro-combustor having a fuel inlet, an exhaust outlet, a combustion chamber and an igniter operative to initiate combustion of fuel within said combustion chamber which produces hot exhaust gas directed to said exhaust outlet;

a fuel control device which supplies fuel from a source to said micro-combustor;

thermoelectric module having a first end mounted in thermal communication with said micro-combustor, and a second end spaced from said first end, a temperature differential being produced between said first and second ends of said thermoelectric module which induces said thermoelectric module to supply electrical energy to an outlet;

a battery charger coupled to said outlet of said thermoelectric module, said battery charger being electrically connected to at least one battery;

a micro-controller coupled to said fuel control device, to said igniter of said micro-combustor and to said thermoelectric module, said micro-controller being effective to open and close said fuel control device, to activate said igniter and to monitor the operation of said thermoelectric module.

9. The system of claim 8 in which said battery charger is a lithium polymer battery charger connected to a number of lithium polymer batteries arranged is series.

10. The system of claim 8 in which the source of fuel contains hydrocarbon fuel in vapor form at ambient temperature, said fuel control device comprising a fuel control valve connected between the source of fuel and said micro-combustor.

11. The system of claim 8 in which the source of fuel contains liquid hydrocarbon fuel, said fuel control device comprising a vaporizer/pump connected between the source of fuel and said micro-combustor.

* * * * *